US012702023B2

(12) United States Patent
Furutani et al.

(10) Patent No.: US 12,702,023 B2
(45) Date of Patent: Aug. 4, 2026

(54) WIRING SUBSTRATE

(71) Applicant: IBIDEN CO., LTD., Ogaki (JP)

(72) Inventors: Toshiki Furutani, Ibi-gun (JP);
Masashi Kuwabara, Ibi-gun (JP)

(73) Assignee: IBIDEN CO., LTD., Ogaki (JP)

( * ) Notice: Subject to any disclaimer, the term of this patent is extended or adjusted under 35 U.S.C. 154(b) by 7 days.

(21) Appl. No.: 18/357,430

(22) Filed: Jul. 24, 2023

(65) Prior Publication Data

US 2024/0030144 A1 Jan. 25, 2024

(30) Foreign Application Priority Data

Jul. 25, 2022 (JP) ................................. 2022-118227

(51) Int. Cl.
| | |
|---|---|
| *H05K 1/02* | (2006.01) |
| *H05K 1/11* | (2006.01) |
| *H05K 3/16* | (2006.01) |
| *H10W 70/60* | (2026.01) |
| *H10W 70/65* | (2026.01) |
| *H10W 70/685* | (2026.01) |
| *H10W 70/692* | (2026.01) |
| *H10B 80/00* | (2023.01) |

(52) U.S. Cl.
CPC ........ *H10W 70/611* (2026.01); *H05K 1/0298* (2013.01); *H05K 1/115* (2013.01); *H05K 3/16* (2013.01); *H10W 70/65* (2026.01); *H10W 70/685* (2026.01); *H10W 70/692* (2026.01); *H05K 2201/096* (2013.01); *H10B 80/00* (2023.02)

(58) Field of Classification Search
CPC ............ H01L 23/5383; H01L 23/5386; H05K 1/0298; H05K 1/111–115
USPC ........................................................ 174/251
See application file for complete search history.

(56) References Cited

U.S. PATENT DOCUMENTS

| | | | |
|---|---|---|---|
| 2019/0098752 A1* | 3/2019 | Sakamoto | ............ H05K 1/0298 |
| 2019/0333847 A1* | 10/2019 | Watanabe | ........... H01L 21/6835 |
| 2021/0272898 A1* | 9/2021 | Takagi | ................... H01L 21/50 |

FOREIGN PATENT DOCUMENTS

JP 2020-004926 A 1/2020

* cited by examiner

*Primary Examiner* — Timothy J Thompson
*Assistant Examiner* — Sidi M Maiga
(74) *Attorney, Agent, or Firm* — Finnegan, Henderson, Farabow, Garrett & Dunner, LLP

(57) ABSTRACT

A wiring substrate includes a first build-up part includes first insulating layers, first conductor layers and first via conductors, and a second build-up part laminated to the first build-up part and including second insulating layers, second conductor layers and second via conductors. The first conductor layers in the first build-up part and the second conductor layers in the second build-up part include wirings such that a wiring width and an inter-wiring distance of the wirings in the first conductor layers are smaller than a wiring width and an inter-wiring distance of the wirings in the second conductor layers, an aspect ratio of the wirings in the first conductor layers is in the range of 2.0 to 4.0, the wiring width of the wirings in the first conductor layers is 3 μm or less, and the inter-wiring distance of the wirings in the first conductor layers is 3 μm or less.

20 Claims, 20 Drawing Sheets

WIRING SUBSTRATE

CROSS-REFERENCE TO RELATED APPLICATIONS

The present application is based upon and claims the benefit of priority to Japanese Patent Application No. 2022-118227, filed Jul. 25, 2022, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2020-4926 describes a wiring substrate that includes a second wiring substrate formed of a build-up wiring layer, and a first wiring substrate joined to the second wiring substrate. The entire contents of this publication are incorporated herein by reference.

SUMMARY OF THE INVENTION

According to one aspect of the present invention, a wiring substrate includes a first build-up part includes first insulating layers, first conductor layers and first via conductors formed in the first insulating layers and connecting the first conductor layers, and a second build-up part laminated to the first build-up part and including second insulating layers, second conductor layers and second via conductors formed in the second insulating layers and connecting the second conductor layers. The first conductor layers in the first build-up part and the second conductor layers in the second build-up part include wirings such that a wiring width and an inter-wiring distance of the wirings in the first conductor layers are smaller than a wiring width and an inter-wiring distance of the wirings in the second conductor layers, an aspect ratio of the wirings in the first conductor layers is in the range of 2.0 to 4.0, the wiring width of the wirings in the first conductor layers is 3 μm or less, and the inter-wiring distance of the wirings in the first conductor layers is 3 μm or less.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a cross-sectional view illustrating an example of a wiring substrate according to an embodiment of the present invention;

FIG. 2N illustrates an example of a method for manufacturing a wiring substrate according to an embodiment of the present invention;

FIG. 3E illustrates another example of a wiring substrate according to an embodiment of the present invention.

DETAILED DESCRIPTION OF THE EMBODIMENTS

Figure 2A:
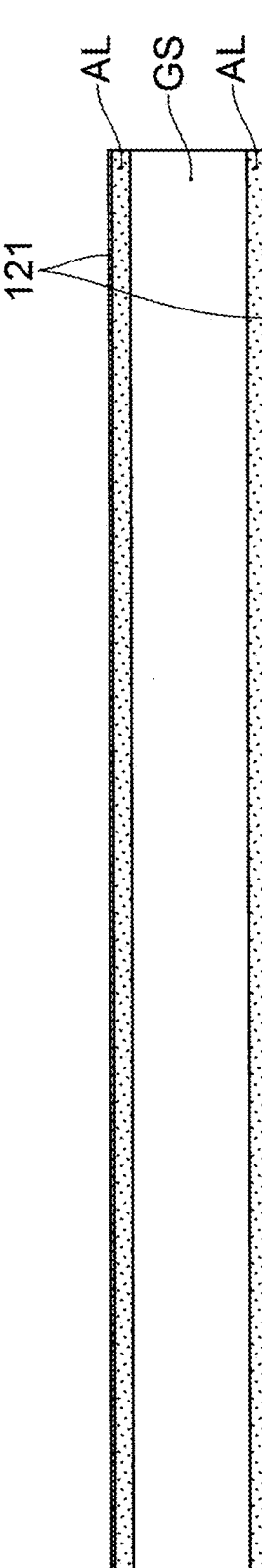
FIG. 2A illustrates an example of a method for manufacturing a wiring substrate according to an embodiment of the present invention.

Embodiments will now be described with reference to the accompanying drawings, wherein like reference numerals designate corresponding or identical elements throughout the various drawings.

Figure 1:
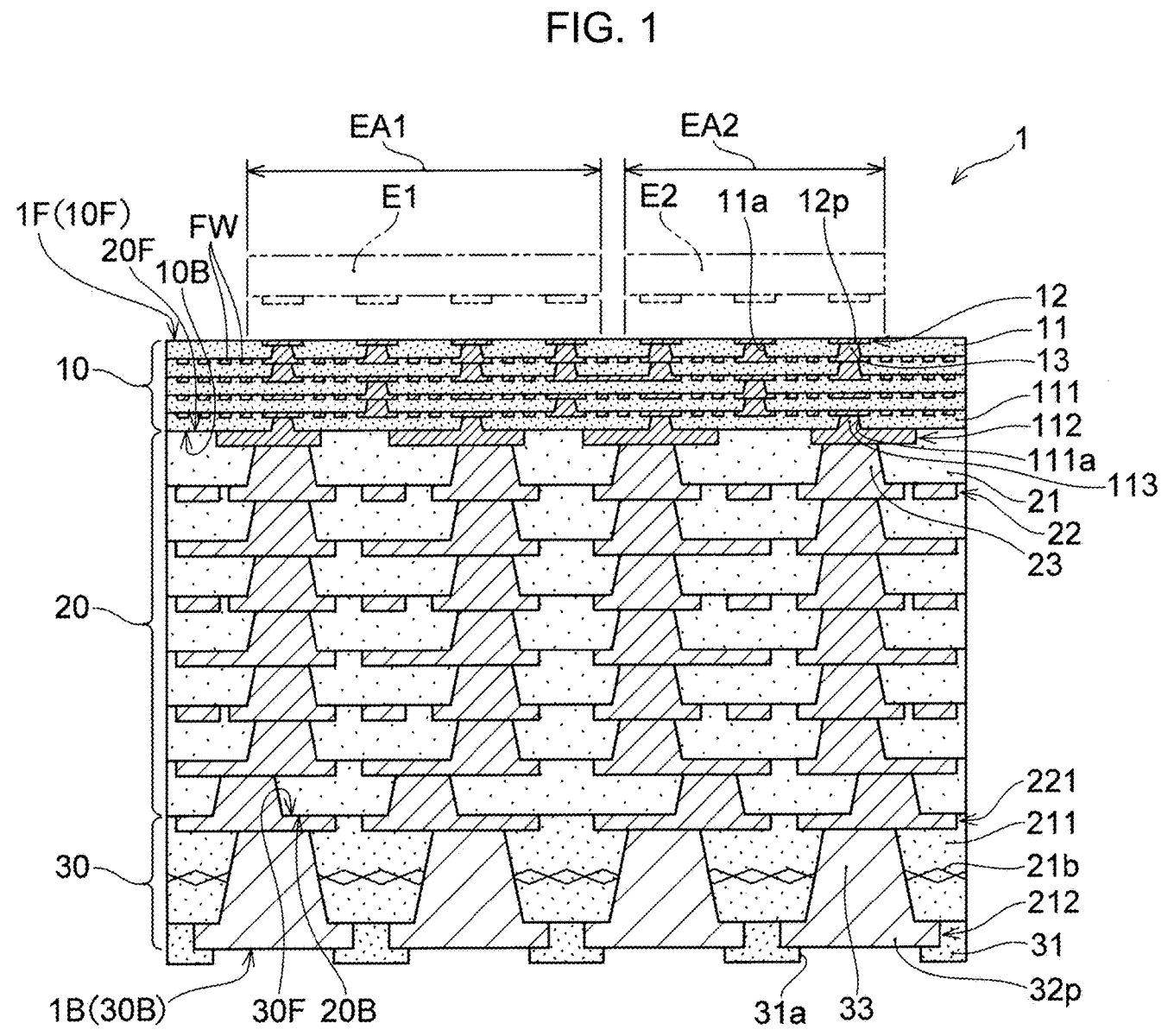

A wiring substrate according to an embodiment of the present invention is described with reference to the drawings. FIG. 1 is a cross-sectional view illustrating a wiring substrate 1 according to an example of a wiring substrate according to an embodiment of the present invention. The wiring substrate 1 is merely an example of the wiring substrate of the present embodiment. A laminated structure, and the number of conductor layers and the number of insulating layers, of the wiring substrate of the present embodiment are not limited to the laminated structure of the wiring substrate 1 of FIG. 1, and the number of conductor layers and the number of insulating layers included in the wiring substrate 1.

The wiring substrate 1 of the embodiment has a laminated structure that includes a first build-up part 10 and a second build-up part 20, which are each formed of alternately laminated multiple conductor layers and multiple insulating layers. The wiring substrate 1 has two surfaces (a first surface (1F) and a second surface (1B) on the opposite side with respect to the first surface (1F)) orthogonal to a thickness direction thereof. As illustrated in FIG. 1, a surface (first surface (10F)) of the first build-up part 10 forms the first surface (1F). The second surface (1B) is formed of a surface (second surface (20B)) of the second build-up part 20. As illustrated in FIG. 1, the wiring substrate 1 may further include a third build-up part 30, which is formed of an insulating layer and a conductor layer laminated thereon, on a side opposite to the first build-up part 10 side of the second build-up part 20. When the wiring substrate 1 includes the third build-up part 30, the second surface (1B) is formed by a surface (second surface (30B)) of the third build-up part 30. The wiring substrate 1 of the present embodiment is preferably a coreless wiring substrate that does not include a core layer.

The first build-up part 10 includes relatively fine wirings and has relatively dense circuit wirings. In the example of FIG. 1, the first build-up part 10 includes alternately laminated insulating layers 11 and conductor layers 12 (first conductor layers 12). Conductor layers 12 facing each other across one insulating layer 11 are connected by via conductors 13 (first via conductors 13). The first build-up part 10 of FIG. 1 further includes an insulating layer 111 formed closest to the second build-up part 20 side. The conductor layers 12 are each patterned to have predetermined conductor patterns. As illustrated in FIG. 1, the first build-up part 10 of the present embodiment does not include a core layer. The first surface (10F) of the first build-up part 10 is formed of a surface (upper surface) of a conductor layer 12 and a surface (upper surface) of an insulating layer 11 exposed from the patterns of the conductor layer 12. In the illustrated example, the conductor layer 12 forming the first surface (10F) has multiple conductor pads (12p).

In the description of the wiring substrate 1 of the present embodiment illustrated in FIG. 1, the first surface (10F) side of the first build-up part 10, that is, the first surface (1F) side of the wiring substrate 1 is referred to as "upper" or an "upper side," and the second surface (1B) side of the wiring substrate 1 is referred to as "lower" or a "lower side." Further, for each of the structural elements, a surface facing the first surface (1F) side of the wiring substrate 1 is also referred to as an "upper surface," and a surface facing the second surface (1B) side of the wiring substrate 1 is also referred to as a "lower surface."

The conductor pads (12p) form a component mounting surface of the wiring substrate 1, which is an uppermost surface of the first build-up part 10, that is, an outermost surface of the wiring substrate 1, and on which external electronic components can be mounted. The component mounting surface of the wiring substrate 1 may have multiple component mounting regions. For example, as illustrated in the example of FIG. 1, two component mounting regions (EA1, EA2) may be formed corresponding to regions where electronic components (E1, E2) are to be mounted.

In mounting external electronic components to the wiring substrate 1 in the illustrated example, upper surfaces of the conductor pads (12p) can be electrically and mechanically connected to the external electronic components, for example, via a conductive bonding material such as solder (not illustrated in the drawings) interposed between the conductor pads (12p) and connection pads of the external electronic components. In this case, for example, a plating layer (not illustrated in the drawings) including a nickel layer and a tin layer may be formed in advance on the upper surfaces of the conductor pads (12p).

When multiple component mounting regions are formed, conductor patterns may be formed in the conductor layers 12 in the first build-up part 10 such that conductor pads (12p) positioned in adjacent component mounting regions can be electrically connected to each other. In using the wiring substrate 1, multiple electronic components to be mounted are electrically connected to each other via the first build-up part 10 via short paths. Further, as a result, it may be possible to improve flexibility in designing circuits via multiple electronic components that can be mounted in using the wiring substrate 1.

Examples of the electronic components (E1, E2) that can be mounted on the wiring substrate 1 include electronic components such as active components such as semiconductor integrated circuit devices and transistors. Specifically, for example, each of the electronic components may be an integrated circuit such as a logic chip incorporating a logic circuit, a processing unit such as an MPU (Micro Processor Unit), or a memory element such as an HBM (High Bandwidth Memory).

In the example of FIG. 1, a second surface (10B) of the first build-up part 10 on the opposite side with respect to the first surface (10F) is formed by a surface (lower surface) of the insulating layer 111. The first build-up part 10 is laminated such that the second surface (10B) thereof faces a first surface (20F) of the second build-up part 20 on the opposite side with respect to the second surface (20B).

The insulating layers 11 of the first build-up part 10 may be formed using an insulating resin such as an epoxy resin or a phenol resin. The insulating layers 11 may contain one of a fluorine resin, a liquid crystal polymer (LCP), a fluoroethylene resin (PTFE), a polyester resin (PE), and a modified polyimide resin (MPI). Examples of the conductor forming the conductor layers 12 and the via conductors 13 include copper, nickel, and the like, and copper is preferably used. In the example illustrated in FIG. 1, the conductor layers 12 and the via conductors 13 are each illustrated as having a single-layer structure. However, the conductor layers 12 and the via conductors 13 may each have a multilayer structure. For example, each of the conductor layers 12 and the via conductors 13 may have a two-layer structure including a metal film layer (preferably a sputtering film layer or an electroless plating film layer) 121 (see FIG. 2H) and a plating film layer (preferably an electrolytic plating film layer) 122 (see FIG. 2H).

The via conductors 13 connecting conductor layers 12 facing each other across an insulating layer 11 are formed by filling through holes (11a) penetrating the insulating layer 11 with conductors. In the example of FIG. 1 the via conductors 13 are integrally formed with the conductor layer 12 provided on a lower side thereof. Therefore, the via conductors 13 and the conductor layer 12 may be formed by the same metal film layer 121 and plating film layer 122. The conductor layers 12 are respectively formed on the lower surfaces of the insulating layers 11. That is, each insulating layer 11 covers the lower surface of an upper insulating layer 11 that is not covered by an upper conductor layer 12 and covers the lower surface of the upper conductor layer 12 and side surfaces of the conductor patterns included in the upper conductor layer 12. The through holes (11a) for forming the via conductors 13 may be formed at the positions in the insulating layers 11 where the via conductors 13 are to be formed, for example, by irradiating laser from the lower surface side of each of the insulating layers 11. A diameter of each of the through holes (11a) is larger on a laser irradiation side and becomes smaller on the opposite side (deep side) with respect to the laser irradiation side. Therefore, the through holes (11a) may be formed such that a diameter (width) on the lower side is large and a diameter (width) on the upper side is small. As illustrated in FIG. 1, the via conductors 13 included in the first build-up part 10 are formed to each have a tapered shape that is reduced in diameter from the second surface (10B) toward the first surface (10F) of the first build-up part 10. For convenience, the term "reduced in diameter" is used. However, a shape of each of the via conductors 13 is not necessarily limited to a circular shape. The term "reduced in diameter" means that a longest distance between two points on an outer circumference of a horizontal cross section of each of the via conductors 13 is reduced. For example, the through holes (11a) are formed such that an aspect ratio of each via conductor 13 ((height from the upper surface of the lower conductor layer 12 to the lower surface of the upper conductor layer, which are in contact with the via conductor 13)/(diameter of the via conductor 13 at the upper surface of the lower conductor layer 12)) is about 0.5 or more and about 1.0 or less. A via diameter of each via conductor 13 (a diameter of the via conductor 13 at the upper surface of the lower conductor layer 12 to which the via conductor 13 is connected) is about 10 μm.

As described above, the conductor layers 12 of the wiring substrate 1 are formed to each have a two-layer structure. For example, each conductor layer 12 includes a first layer 121 (that is, an upper layer of the conductor layer 12) formed on the lower surface of an insulating layer 11 and a second layer 122 (that is, a lower layer of the conductor layer 12) formed below the first layer 121. In forming a conductor layer 12, first, to form the first layer 121 of the conductor layer 12, on inner walls of the through holes (11a) and on the surface of the insulating layer 11, a metal film (121a) (see FIG. 2D) that forms the first layer 121 (see FIG. 2H) of the conductor layer 12 is formed, for example, by sputtering or the like.

Next, to form the second layer 122 of the conductor layer 12, on the formed metal film (121a), a plating resist (R1) (see FIGS. 2E and 2F) having openings (R11) corresponding to the conductor patterns to be included in the conductor layer 12 is provided, for example by lamination of a dry film resist and exposure and development or the like. The second layer 122 of the conductor layer 12 is formed by filling the openings (R11) of the plating resist (R1) with an electrolytic plating film using the metal film (121a) as a seed layer.

Figure 2B:
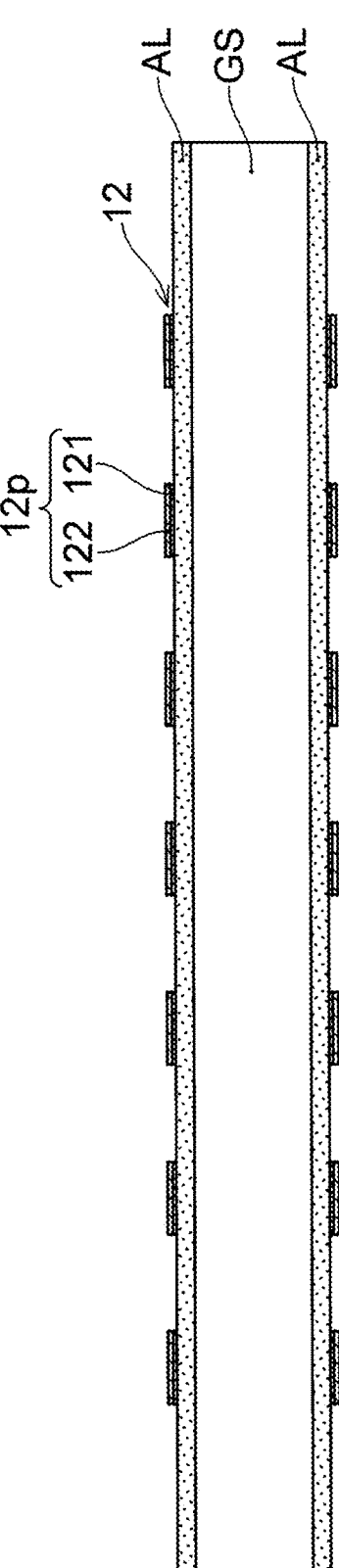
FIG. 2B illustrates an example of a method for manufacturing a wiring substrate according to an embodiment of the present invention.
Figure 2C:
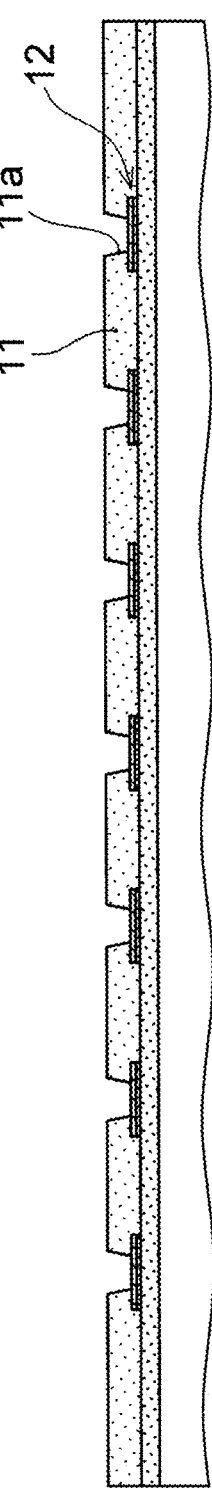
FIG. 2C illustrates an example of a method for manufacturing a wiring substrate according to an embodiment of the present invention.
Figure 2D:
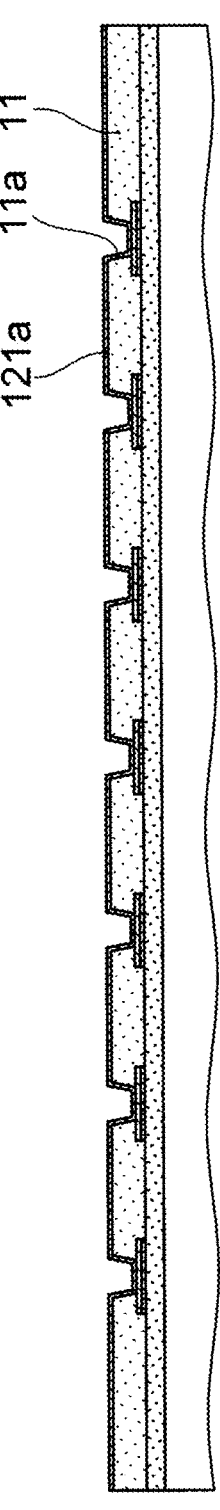
FIG. 2D illustrates an example of a method for manufacturing a wiring substrate according to an embodiment of the present invention.
Figure 2E:
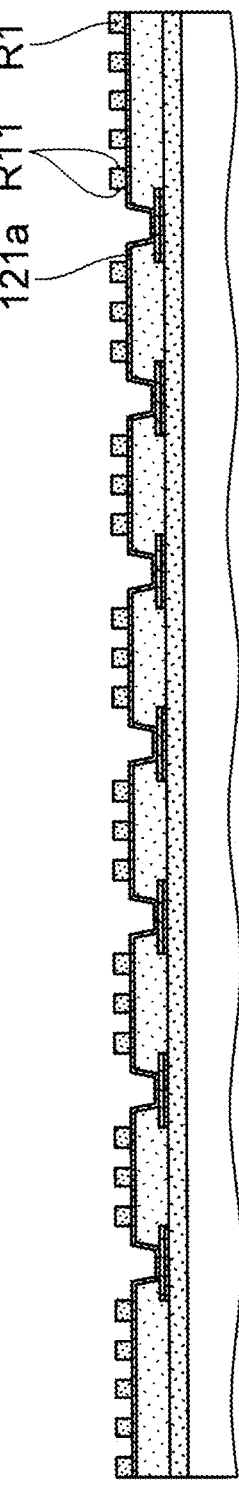
FIG. 2E illustrates an example of a method for manufacturing a wiring substrate according to an embodiment of the present invention.
Figure 2F:
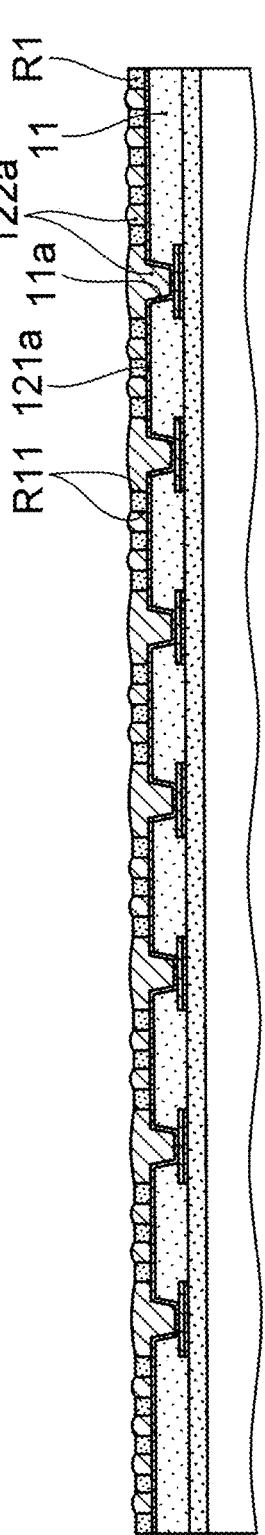
FIG. 2F illustrates an example of a method for manufacturing a wiring substrate according to an embodiment of the present invention.

Specifically, an electrolytic plating film (122a) formed by electrolytic plating using the metal film (121a) as a power feeding layer is formed thicker than the plating resist (R1) (see FIG. 2F). For example, the electrolytic plating film (122a) is formed thicker than the plating resist (R1) by 1 μm or more. The electrolytic plating film (122a) completely fills the through holes (11a) of the insulating layer 11. As a result, the via conductors 13 are integrally formed with the conductor layer 12.

After that, a part of the electrolytic plating film (122a) in the thickness direction is removed by polishing. For example, a part of the electrolytic plating film (122a) is removed by chemical mechanical polishing (CMP) or sandblasting (see FIG. 2G). By this polishing, a part of the plating resist (R1) in the thickness direction is also removed. Specifically, the electrolytic plating film (122a) is polished together with the plating resist (R1) until a predetermined thickness required for the second layer 122 of the conductor layer 12 is reached. Therefore, after the electrolytic plating film (122a) is formed, for example, as illustrated in FIG. 2F, even when the surface has unevenness, the surface of the second layer 122 (the upper surface of the second layer 122 illustrated in FIG. 2H) of the conductor layer 12 that has been subjected to polishing is flattened. That is, the surface (lower surface) of each of the conductor layers 12 of the first build-up part 10 of the wiring substrate 1 is a highly flat polished surface.

When the surface (lower surface) of each of the conductor layers 12 is such a polished surface with less unevenness, it may be possible that good high-frequency transmission characteristics is obtained in the first build-up part 10. It is thought that a problem such as misalignment during the formation of the via conductors 13 connecting the conductor layers 12 is also unlikely to occur. Further, since the entire surface (lower surface) of each of the conductor layers 12 is polished, each of the conductor layers 12 in the first build-up part 10 is formed with high flatness without undulation or the like regardless of the unevenness or density of the conductor patterns in the conductor layers 12. It is thought that the flatness of the first build-up part 10 is improved and a high quality wiring substrate 1 is obtained.

The conductor layers 12 of the wiring substrate 1 have fine wirings (FW), which are high-density wirings with relatively small pattern widths and inter-pattern distances. The fine wirings (FW) have the smallest pattern widths and inter-pattern distances among the wirings of the wiring substrate 1.

In the illustrated example, among the multiple conductor layers 12 included in the first build-up part 10, four conductor layers 12 have fine wirings (FW), which are high-density wirings. However, it is also possible that some of the four conductor layers 12 have fine wirings (FW). The number of the conductor layers 12 having fine wirings (FW) in the first build-up part 10 is not limited.

The fine wirings (FW) included in the first build-up part 10 have smaller pattern widths and inter-pattern distances than pattern widths and inter-pattern distances of wirings included in conductor layers 22 in the second build-up part 20 to be described later. Specifically, for example, the fine wirings (FW) have wiring widths of about 3 μm or less and inter-wiring distances of about 3 μm or less. Since the first build-up part 10 has the fine wirings (FW), it may be possible to provide wirings with more appropriate characteristics for electrical signals that are transmitted via the wirings in the first build-up part 10. Further, it is thought that it may be possible to increase a density of the wirings in the first build-up part 10 and to improve a degree of freedom in wiring design. From the same point of view, the aspect ratio of the conductor layers 12 having the fine wirings (FW) is, for example, 2.0 or more and 4.0 or less.

When the conductor layers 12 are formed to include the fine wirings (FW) formed with fine pitch and aspect ratio as described above, it may be preferable that the via conductors 13 connecting opposing conductor layers 12 are also formed at a fine pitch. The through holes (11a) for the via conductors 13 are formed with small diameters in the insulating layers 11. Therefore, although the insulating layers 11 contain inorganic fillers such as fine particles of silica (SiO2), alumina, mullite, or the like, to facilitate the formation of the through holes (11a) with small diameters, it may be preferred that the insulating layers 11 do not contain inorganic fillers.

In the first build-up part 10 including the conductor layers 12 including the fine wirings (FW), the insulating layers 11 each have a thickness of, for example, about 7.5-10 μm. Further, in this case, the insulating layers 11 preferably do not each contain a core material (reinforcing material) formed of a glass fiber, an aramid fiber, or the like.

The conductor layers 12 each have a thickness of about 7 μm or less. When the conductor layers 12 include the fine wirings (FW), the metal film layer 121 (see FIG. 2H) of the two-layer structure of the conductor layers 12 and the via conductors 13 are preferably a sputtering film layer formed by sputtering.

As illustrated in FIG. 1, the first build-up part 10 is laminated on the second build-up part 20. That is, the second surface (10B) of the first build-up part 10, which is formed by the lower surface of the insulating layer 111, which is the lowermost layer in the first build-up part 10, faces the first surface (20F) of the second build-up part 20.

Similar to the first build-up part 10, the second build-up part 20 includes alternately laminated insulating layers 21 and conductor layers 22 (second conductor layers). In each of the insulating layers 21, via conductors 23 that penetrate the each of the insulating layers and connect conductor layers that adjacent to each other via the each of the insulating layers are formed. The conductor layers 22 are each patterned to have predetermined conductor patterns. As illustrated in FIG. 1, the second build-up part 20 of the present embodiment does not include a core layer.

The insulating layer 111 of the first build-up part 10 includes via conductors 113 formed by filling through holes (111a) penetrating the insulating layer 111 with conductors. A conductor layer 112 is formed on the lower surface of the insulating layer 111. The conductor layer 112 is patterned to have predetermined conductor patterns. The via conductors 113 connect the conductor layer 112 and the conductor layer 12 in the first build-up part 10 that faces the conductor layer 112 across the insulating layer 111.

In the second build-up part 20, the conductor layers 22 are respectively formed on the lower surfaces of the insulating layers 21. The lower surface of an insulating layer 21 that is not covered by a conductor layer 22, and the conductor layer 22, are covered by a lower insulating layer 21. The uppermost insulating layer 21 that forms the first surface (20F) of the second build-up part 20 covers the conductor layer 112 and the lower surface of the insulating layer 111 of the first build-up part 10 that is not covered by the conductor layer 112.

As illustrated in FIG. 1, in the wiring substrate 1, the second build-up part 20 may be laminated on the third build-up part 30. The second surface (20B) of the second build-up part 20, which is formed by the lower surface of the lowermost insulating layer 21 of the second build-up part 20, faces a first surface (30F) of the third build-up part 30. The third build-up part 30 includes an insulating layer 211 and a conductor layer 212 formed on a lower surface of the insulating layer 211. The insulating layer 211 covers the lowermost conductor layer 22 (conductor layer 221) of the second build-up part 20 and the lower surface of the lowermost insulating layer 21 of the second build-up part 20 that is not covered by the conductor layer 221. In the insulating layer 211, via conductors 33 that penetrate the insulating layer 211 and connect the conductor layer 212 and the conductor layer 221 of the second build-up part 20 are formed.

The insulating layers 21 of the second build-up part 20 are formed using the same insulating resin as the insulating layers 11. The insulating layers (11, 21) in the build-up parts may contain the same insulating resin or insulating resins different from each other. The insulating layers 21 may each contain a core material (reinforcing material) formed of a glass fiber or an aramid fiber. The insulating layer 211 of the third build-up part 30 contains a core material (21b) formed of a glass fiber. Each of the insulating layers (21, 211) further contains an inorganic filler (not illustrated in the drawings) formed of fine particles of silica ($SiO_2$), alumina, mullite, or the like.

Similar to the conductor layers 12 and the via conductors 13, the conductor layers 22 of the second build-up part 20 and the conductor layer 212 of the third build-up part 30, as well as the via conductors (23, 33), may be formed using any metal such as copper or nickel. As illustrated in FIG. 1, similar to the via conductors 13 in the first build-up part 10, the via conductors 23 included in the second build-up part 20 and the via conductors 33 included in the third build-up part 30 are formed to each have a tapered shape that is reduced in diameter from the second surface (1B) side toward the first surface (1F) side of the wiring substrate 1.

As described above, the wirings included in the conductor layers 22 of the second build-up part 20 and the conductor layer 212 of the third build-up part 30 have larger pattern widths and inter-pattern distances than the wirings included in the conductor layers 12 of the first build-up part 10. The conductor layers 22 are formed thicker than the conductor layers 12, and each have a thickness of, for example, about 10 μm or more. The conductor layers 22 of the second build-up part 20 do not include wiring patterns that are formed at a fine pitch about the same as that of the fine wirings (FW) of the first build-up part 10. For example, the wirings included in the conductor layers 22 have a minimum wiring width of about 4 μm and a minimum inter-wiring distance of about 6 μm. The aspect ratio of the wirings included in the conductor layers 22 is substantially the same as the aspect ratio of the fine wirings (FW) of the conductor layers 12, for example, about 2.0 or more and 4.0 or less. A via diameter of each via conductor 23 (the diameter of the via conductor 23 at the upper surface of the lower conductor layer 22 to which the via conductor 23 is connected) is about 50 μm.

In the wiring substrate 1 of the present embodiment, for example, as illustrated in the example of FIG. 1, the insulating layer 211 and the conductor layer 212 of the third build-up part 30 are both formed thicker than the insulating layers 21 and the conductor layers 22 in the second build-up part 20. For example, the insulating layer 211 has a thickness of about 100 μm or more and 200 μm or less. Further, the conductor layer 212 has a thickness of about 20 μm. A via diameter of each of the via conductors 33 formed in the insulating layer 211 (a diameter of each of the via conductors 33 on the upper surface of the conductor layer 212) is approximately 100 μm.

Similar to the conductor layers 12 and the via conductors 13, the conductor layers (22, 212) and the via conductors (23, 33) may be formed to each have a multilayer structure, for example, each have a two-layer structure including a metal film layer (preferably a sputtering film layer or an electroless plating film layer) and a plating film layer (preferably an electrolytic plating film layer). The second build-up part 20 and the third build-up part 30 do not include fine wiring patterns such as the fine wirings (FW) of the first build-up part 10. In such a case, of the two-layer structure of each of the conductor layers 22 and the via conductors 23 and the conductor layer 212 and the via conductors 33, the metal film layer is an electroless plating film layer formed by an electroless plating film, in particular, an electroless copper plating film layer, and the plating film layer may be an electrolytic plating film layer formed by an electrolytic plating film, in particular, an electrolytic copper plating film layer.

In the example of FIG. 1, the wiring substrate 1 further includes a solder resist layer 31 formed on the surfaces of the insulating layer 211 and the conductor layer 212. The solder resist layer 31 is formed using, for example, a photosensitive polyimide resin or epoxy resin. Openings (31a) are formed in the solder resist layer 31, and conductor pads (32p) of the conductor layer 212 of the third build-up part 30 are exposed from the openings (31a).

The second surface (1B) of the wiring substrate 1 on the opposite side with respect to the component mounting surface of the wiring substrate 1 can be a connection surface that is to be connected to an external element such as an external wiring substrate (for example, a motherboard of any electrical device) when the wiring substrate 1 itself is mounted on the external element. The conductor pads (32p) can be connected to any substrate, electrical component, mechanism component, or the like.

The wiring substrate of the embodiment may include a wiring layer having a form of embedded wirings in the first build-up part. A wiring substrate 3 of this example is illustrated in FIG. 3E.

Similar to the first build-up part 10 of the wiring substrate 1 illustrated in FIG. 1, a first build-up part 50 of the wiring substrate 3 includes relatively fine wirings. The first build-up part 50 includes alternately laminated insulating layers 51 and conductor layers 52. Via conductors 53 connecting conductor layers 52 or connecting a conductor layer 52 and a conductor layer 12, which face each other across an insulating layer 51, are formed by filling through holes (51a) penetrating the insulating layer 51 with conductors. In the example of FIG. 3E, the via conductors 53 are integrally formed with the conductor layer 52 provided on a lower side thereof and are embedded together with the conductor layer 52 in the same insulating layer 51. The via conductors 53 and the conductor layer 52 are formed by the same metal film layer (preferably a sputtering film layer or an electroless plating film layer) 521 (see FIG. 3B) and plating film layer (preferably an electrolytic plating film layer) 522 (see FIG. 3B). Similar to the through holes (11a) of the wiring substrate 1, the through holes (51a) for forming the via conductors 53 may be formed by irradiating laser from the lower surface of each of the insulating layers 51 toward an upper side, that is, toward a conductor layer (the conductor layer 12 or a conductor layer 52) formed on an upper side of the each of the insulating layers 51. Therefore, the through holes (51a) may be formed such that a diameter (width) on the lower side is large and a diameter (width) on the upper side is small. The via conductors 53 are formed to each have a tapered shape that is reduced in diameter from a second surface (50B) toward a first surface (50F) of the first build-up part 50.

Figure 3A:
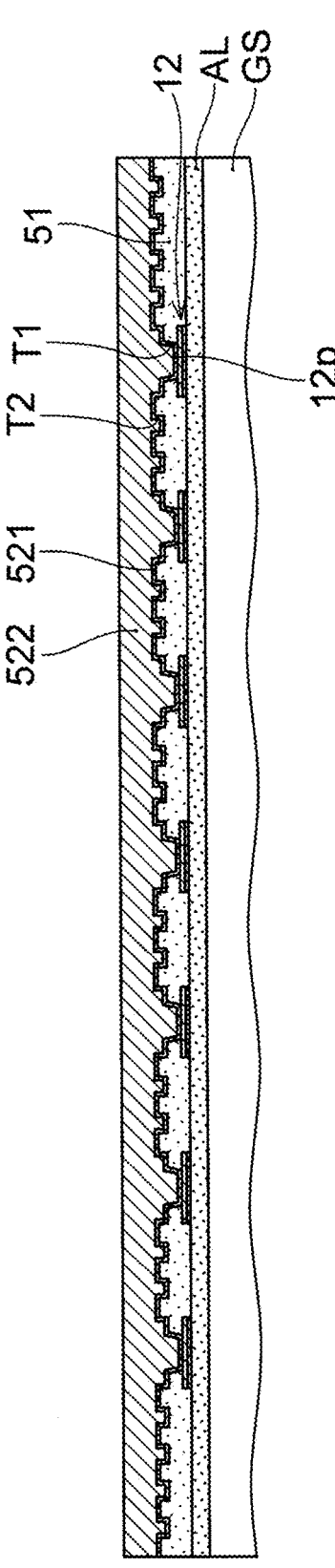
FIG. 3A illustrates an example of a method for manufacturing a wiring substrate according to another embodiment of the present invention.

"Embedded wirings" refers to the shape of the conductor layer 52 when the via conductors 53 and the conductor layer 52 provided on the lower side thereof are embedded in the same insulating layer 51 as described above. Specifically, among the multiple conductor layers 52, any conductor layer 52 may have a form of embedded wirings that are embedded in an upper insulating layer 51 and are formed by filling grooves formed in the insulating layer 51 as illustrated in FIG. 3A with conductors. Preferably, among the multiple conductor layers of the first build-up part 50 of the wiring substrate 3, all the conductor layers (conductor layers 52) other than the conductor layer 12 that forms the first surface (50F) are each formed to have embedded wirings embedded in an upper insulating layer 51. A conductor layer 52 having a form of embedded wirings has fine wirings (FW), which are high-density wirings with relatively small pattern widths and inter-pattern distances. The fine wirings (FW) have the smallest pattern widths and inter-pattern distances among the wirings of the wiring substrate 3.

The fine wirings (FW) included in the first build-up part 50 of the wiring substrate 3 have substantially the same wiring widths and inter-wiring distances as the fine wirings (FW) included in the first build-up part 10 of the wiring substrate 1. A conductor layer 52 having fine wirings (FW) is also formed to have about the same aspect ratio as a conductor layer 12 having fine wirings (FW). The via conductors 53 also have substantially the same aspect ratio and via diameter as the via conductors 13.

In the illustrated example, among the multiple conductor layers included in the first build-up part 50, the four conductor layers 52 have a form of embedded wirings, and all the four layers have fine wirings (FW), which are high-density wirings. However, it is also possible that some of the four conductor layers 52 have fine wirings (FW). The number of the conductor layers 52 having fine wirings (FW) in the first build-up part 50 is not limited.

As will be described later, in a method for manufacturing the wiring substrate 3 of the embodiment, a conductor layer 52 having a form of embedded wirings is formed such that the surface (lower surface) of the conductor layer 52 and the surface (lower surface) of the insulating layer 51 are flush with each other by partially removing the metal film layer 521 (preferably a sputtering film layer) and the plating film layer 522, which form the conductor layer 52, in the thickness direction by polishing. At the same time, by this polishing process, the surface (lower surface) of the conductor layer 52 exposed from the insulating layer 51 is flattened. Therefore, similar to the surfaces of the conductor layers 12 of the wiring substrate 1, the surfaces (lower surfaces) (exposed from the insulating layers 51) of the conductor layers 52 having a form of embedded wirings included in the first build-up part 50 are highly flat polished surfaces.

Preferably, the second build-up part 20 and the third build-up part 30 included in the wiring substrate 3 are structured in the same forms as the second build-up part 20 and the third build-up part 30 of the wiring substrate 1. That is, in the example of FIG. 3E, the conductor layers 22 in the second build-up part 20 and the conductor layer 212 in the third build-up part 30 do not have a form of embedded wirings.

Next, with reference to FIGS. 2A-2N, a method for manufacturing a wiring substrate of the embodiment is described using a case where the wiring substrate 1 illustrated in FIG. 1 is manufactured as an example. Structural elements formed in the manufacturing method to be described below may be formed using the materials exemplified as the materials of the corresponding structural elements in the description of the wiring substrate 1 in FIG. 1, unless otherwise specified. In the following description about the manufacture of the wiring structure 1, a side closer to the support substrate (GS) is referred to as "lower" or a "lower side," and a side farther from the support substrate (GS) is referred to as "upper" or an "upper side." Therefore, of each of the elements of the wiring structure a, a surface facing the support substrate (GS) is referred to as a "lower surface," and a surface facing the opposite side with respect to the support substrate (GS) is also referred to as an "upper surface."

The wiring substrate 1 may be formed by manufacturing the first build-up part 10 on the support substrate (GS) and manufacturing the second build-up part 20 on the first build-up part 10 and the third build-up part 30 on the second build-up part 20 (see FIG. 1). In this way, by first manufacturing the first build-up part 10 on the support substrate (GS) and removing the support substrate (GS) after the second build-up part 20 and the third build-up part 30 are formed on the first build-up part 10, it is thought that a yield in manufacturing the wiring substrate 1 can be improved. Further, according to the manufacturing method of the embodiment, since the component mounting surface of the wiring substrate 1 is an exposed surface after the support substrate (GS) is removed, it is thought that a wiring substrate 1 having a highly flat component mounting surface can be obtained. For example, the wiring substrate 1 of the embodiment can be formed such that a height difference of the component mounting surface in the thickness direction is about ±10 μm.

First, as illustrated in FIG. 2A, a support substrate (GS) having good surface flatness, such as a glass substrate, is prepared. On both sides of the support substrate (GS), a metal film layer 121 is formed via an adhesive layer (AL) containing, for example, an azobenzene-based polymer adhesive that can be attached or detached by irradiation with light. The metal film layer 121 is, for example, a metal film (preferably copper film) layer formed by electroless plating or sputtering or the like. It is also possible that the metal film layer 121 is formed of a relatively thin metal foil.

Next, as illustrated in FIG. 2B, a conductor layer 12 that has multiple conductor pads (12p) and includes the metal film layer 121 and a plating film layer 122 is formed via the adhesive layer (AL) on the support substrate (GS).

In forming the conductor layer 12, for example, a plating resist is formed on the metal film layer 121, and openings are formed in the plating resist according to formation regions of patterns of the conductor pads (12p), for example, by photolithography. Next, the plating film layer 122 is formed in the openings by electrolytic plating using the metal film layer 121 as a seed layer. After the formation of the plating film layer 122, the plating resist is removed, and the metal film layer 121 exposed by the removal of the plating resist is etched and the state illustrated in FIG. 2B is formed.

Next, as illustrated in FIG. 2C, an insulating layer 11 covering the conductor layer 12 is formed. As the insulating layer 11, for example, an insulating resin such as an epoxy resin or a phenol resin may be used. A fluorine resin, a liquid crystal polymer (LCP), a fluoroethylene resin (PTFE), a polyester resin (PE), or a modified polyimide resin (MPI) also may be used. The insulating layer 11 is formed by thermocompression bonding these resins molded into a film-like shape. Next, through holes (11a) are formed at formation positions of via conductors 13 (see FIG. 1) in the insulating layer 11, for example, by irradiation with $CO_2$ laser, excimer laser, or the like.

Although not illustrated, the formation of the through holes (11a) by irradiation with laser such as $CO_2$ laser may be performed by irradiating laser while protecting the surface of the insulating layer 11 by covering the surface with a protective film such as a polyethylene terephthalate (PET) film. The through holes (11a) penetrating the protective film and the insulating layer 11 are formed. Further, after the through holes (11a) are formed, a desmear treatment may be performed to prevent a decrease in adhesion or an increase in a resistance component or the like during the formation of the conductor layer 12 due to a processing-modified substance occurring at bottoms of the through holes (11a). The desmear treatment is preferably a dry desmear treatment using a plasma gas. The desmear treatment may also be performed while protecting the surface of the insulating layer 11 in a state in which a protective film such as a polyethylene terephthalate (PET) film is formed on the surface of the insulating layer 11.

In FIG. 2C, and FIGS. 2D-2N and 3A-3D to be referenced below, the laminate formed on the surface on one side of the support substrate (GS) is illustrated, and illustration of the laminate that may be formed on the surface on the opposite side is omitted. However, on the surface on the opposite side, conductor layers and insulating layers may be formed in the same manner and number as those on the surface on the one side or in different manner and number from those on the surface on the one side, or it is also possible that such conductor layers and insulating layers are not formed.

As illustrated in FIG. 2D, a metal film (seed layer)(121a) forming a first layer 121 (see FIG. 2H) of a conductor layer 12 is formed on inner walls of the through holes (11a) and the surface of the insulating layer 11 by electroless plating or sputtering or the like. Preferably, the metal film (121a) is a sputtering film formed by sputtering. When a protective film is provided on the surface of the insulating layer 11 during the formation of the through holes (11a) and/or during the desmear treatment, the protective film can be peeled off before the formation of the metal film (121a).

As illustrated in FIG. 2E, a plating resist (R1) having openings (R11) corresponding to conductor patterns included in the conductor layer 12 is provided on the metal film (121a).

As illustrated in FIG. 2F, an electrolytic plating film (122a) is formed with a height higher than that of the plating resist (R1) in the openings (R11) of the plating resist (R1) by electrolytic plating using the metal film (121a) as a power feeding layer. The electrolytic plating film (122a) can be formed to have a height higher than that of the openings (R11) and is formed, for example, to have a convex spherical surface that protrudes upward. For example, the electrolytic plating film (122a) filled in the openings (R11) can be formed thicker than the plating resist (R1) by 1 μm or more.

Figure 2G:
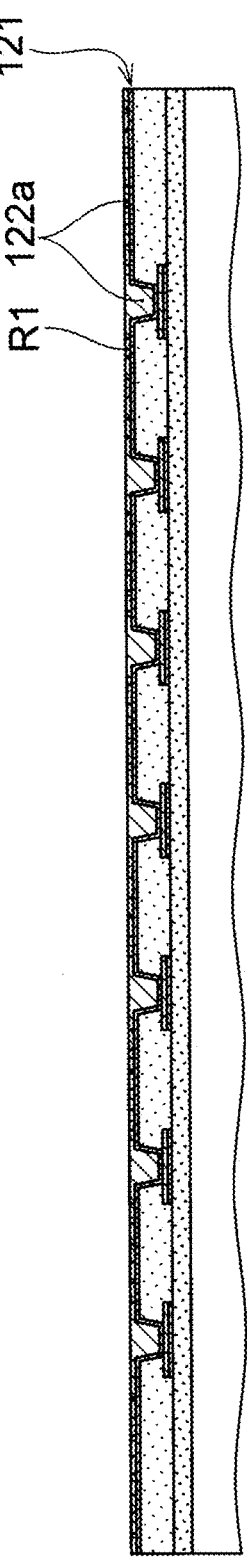
FIG. 2G illustrates an example of a method for manufacturing a wiring substrate according to an embodiment of the present invention.

Next, as illustrated in FIG. 2G, the electrolytic plating film (211a) and the plating resist (R1) are partially removed by polishing. The polishing is performed until the thickness of the electrolytic plating film (122a) reaches a predetermined thickness required for a second layer 122 of the conductor layer 12. It is thought that the thickness of the second layer 122 can be easily adjusted. For example, the conductor layer 12 has a thickness of about 7 μm or less. Then, the second layer 122 of the two-layer structure of the conductor layer 12 is formed to have a thickness of, for example, about 6.5 μm or less.

Figure 2H:
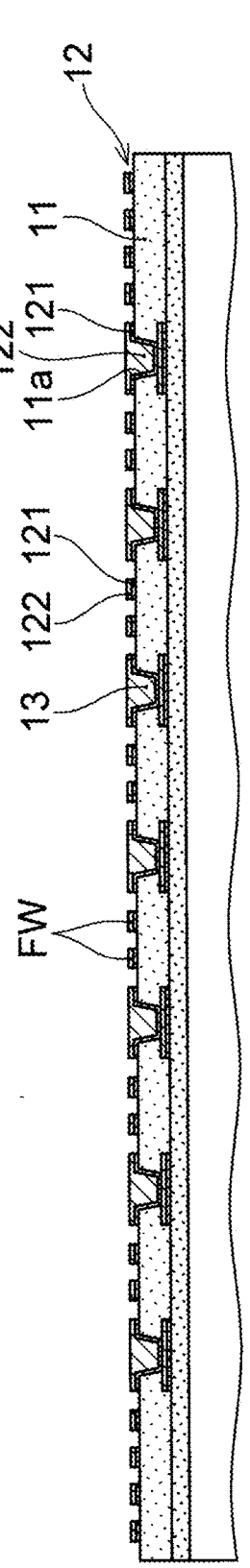
FIG. 2H illustrates an example of a method for manufacturing a wiring substrate according to an embodiment of the present invention.

As illustrated in FIG. 2H, after the plating resist (R1) is removed, a portion of the metal film (121a) that is not covered by the upper layer 122 is removed by etching or the like. As a result, a conductor layer 12 that includes fine wirings (FW) and has a two-layer structure including the first layer 121 and the second layer 122 is formed. Further, the via conductors 13 are formed by completely filling the through holes (11a) with the electrolytic plating film (122a).

Figure 2I:
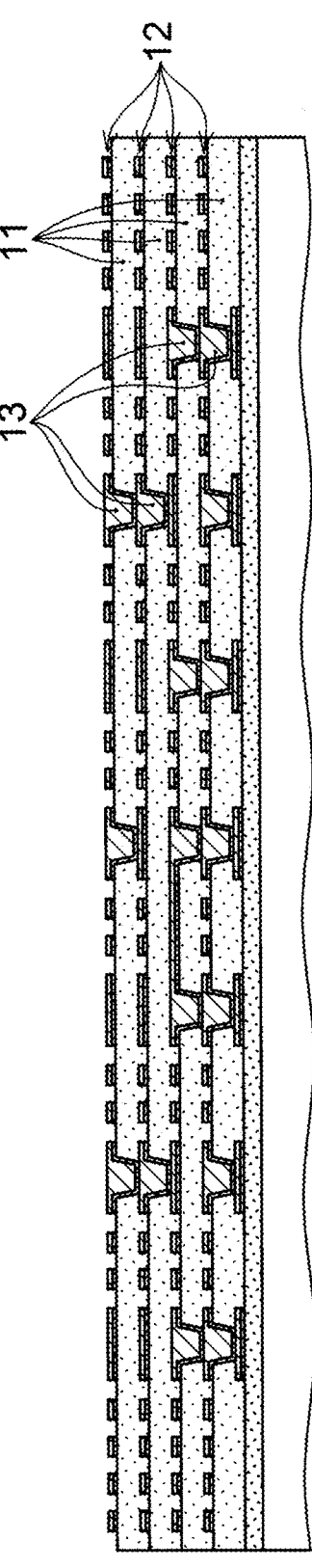
FIG. 2I illustrates an example of a method for manufacturing a wiring substrate according to an embodiment of the present invention.

Subsequently, as illustrated in FIG. 2I, using the same methods as the methods for forming the insulating layer 11, the conductor layer 12 and the via conductors 13 described above, on the conductor layer 12 and the insulating layer 11, a desired number of insulating layers 11 and conductor layers 12, and via conductors 13 penetrating the respective insulating layers, are formed.

Figure 2J:
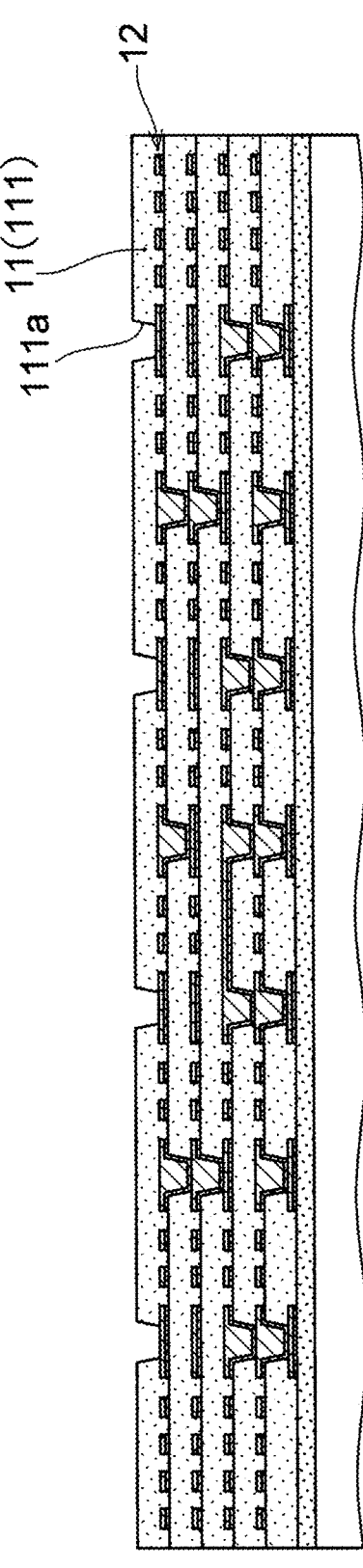
FIG. 2J illustrates an example of a method for manufacturing a wiring substrate according to an embodiment of the present invention.

Next, as illustrated in FIG. 2J, on the upper side of the conductor layer 12, an insulating layer 111, which is the outermost layer among the insulating layers 11 of the first build-up part 10, is formed. After that, through holes (111a) for forming via conductors 113 are formed by laser processing in the insulating layer 111 at positions corresponding to formation locations of the via conductors 113 (see FIG. 1).

Figure 2K:
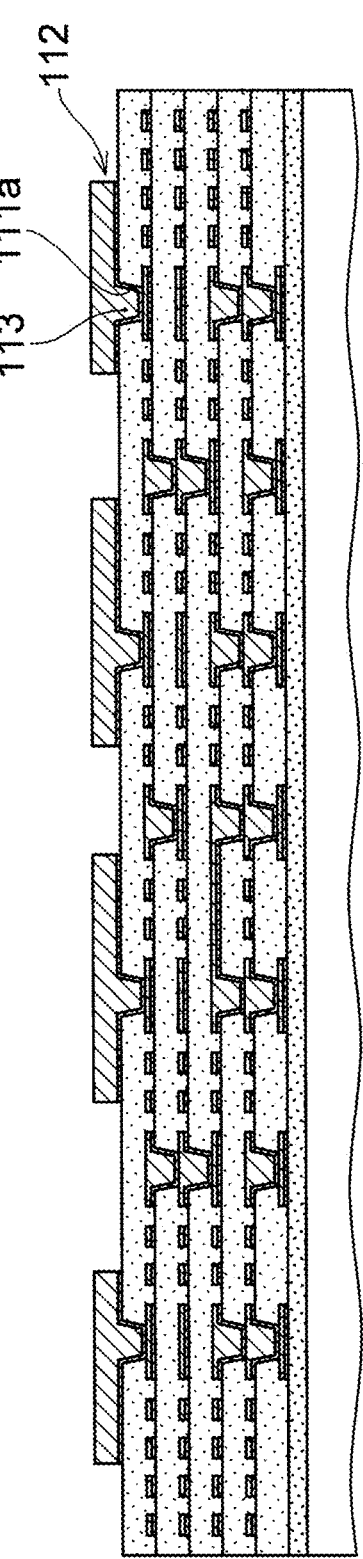
FIG. 2K illustrates an example of a method for manufacturing a wiring substrate according to an embodiment of the present invention.

Subsequently, as illustrated in FIG. 2K, at the same time as the via conductors 113 filling the through holes (111a) are formed, a conductor layer 112 is formed using any method for forming conductor patterns, such as a semi-additive method.

Figure 2L:
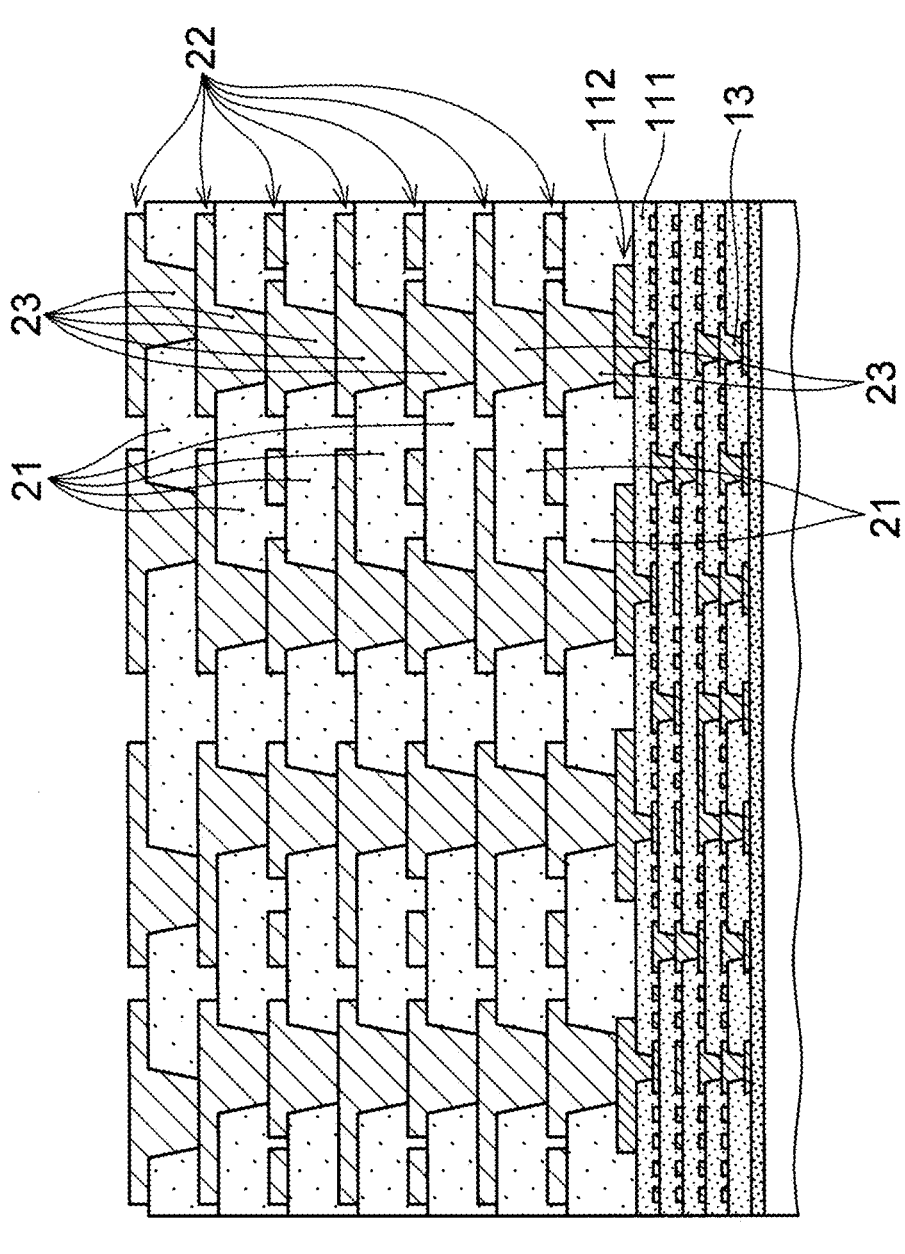
FIG. 2L illustrates an example of a method for manufacturing a wiring substrate according to an embodiment of the present invention.

Subsequently, as illustrated in FIG. 2L, using the same methods as the methods for forming the insulating layer 111, the conductor layer 112 and the via conductors 113 described above, on the conductor layer 112 and the insulating layer 111, a desired number of insulating layers 21 and conductor layers 22, and via conductors 23 penetrating the respective insulating layers, are formed. The second build-up part 20 is formed on the first build-up part 10.

Figure 2M:
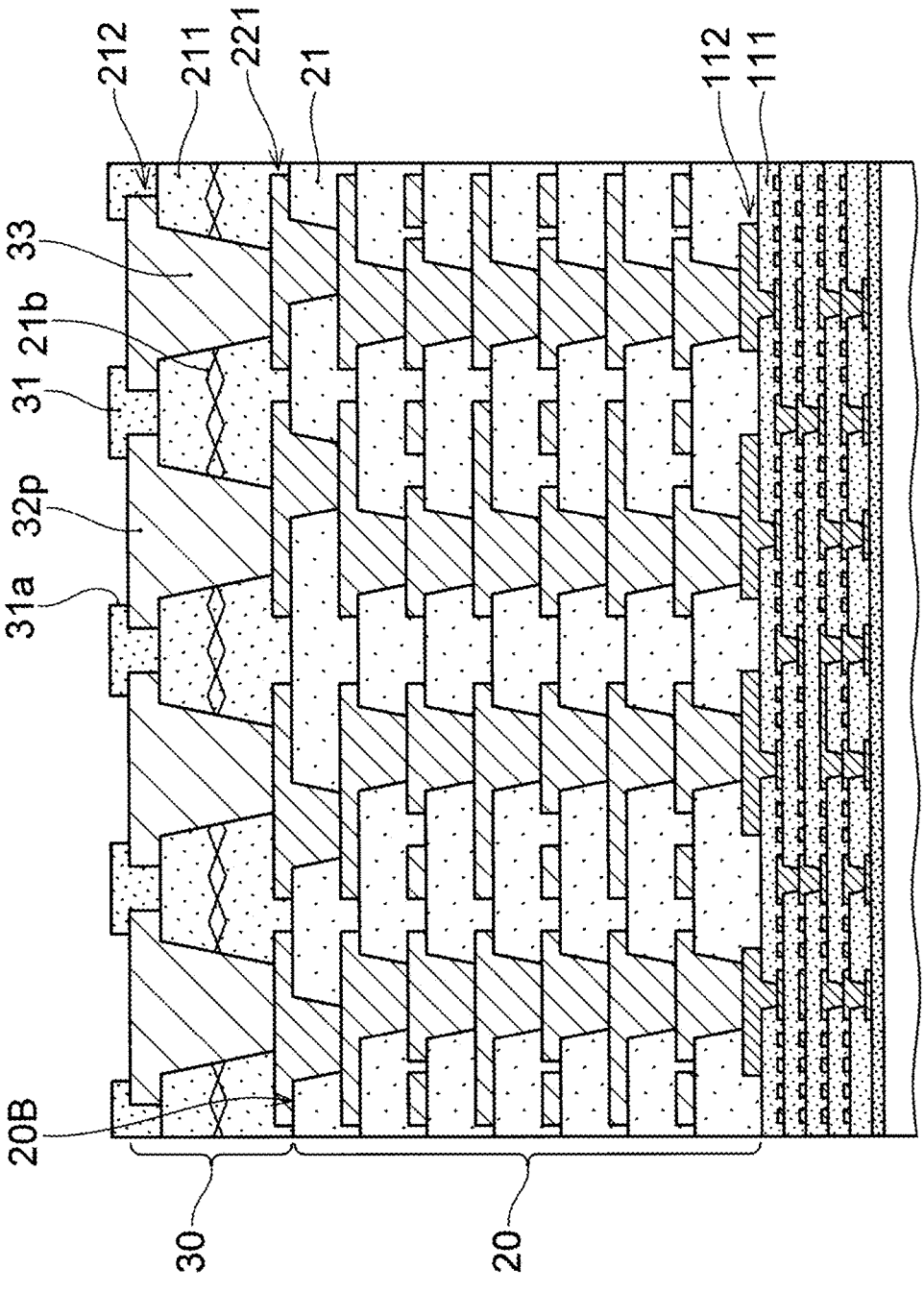
FIG. 2M illustrates an example of a method for manufacturing a wiring substrate according to an embodiment of the present invention.
Figure 2N:
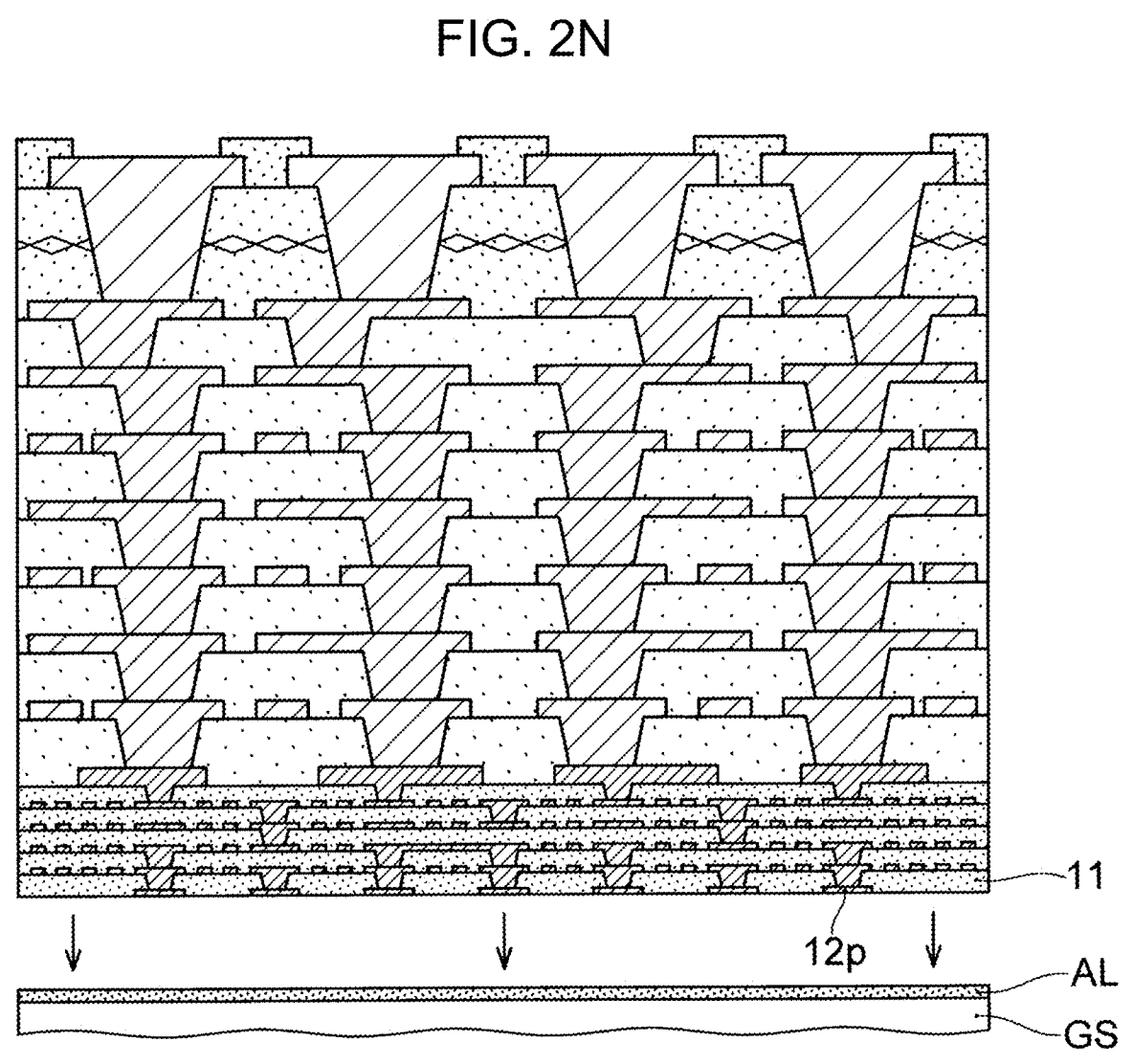

As illustrated in FIG. 2M, on the outermost insulating layer 21 and the outermost conductor layer 22 (conductor layer 221) on the second surface (20B) side of the second build-up part 20, the insulating layer 211, the conductor layer 212 and the via conductors 33 penetrating the insulating layer 211 of the third build-up part 30 are formed using the same methods as the methods for forming the insulating layer 111, the conductor layer 112 and the via conductors 113. As an insulating resin forming the insulating layer 211, a prepreg containing an insulating resin such as an epoxy resin or a BT resin impregnated in a reinforcing material (core material) (21b) formed of a glass fiber is used.

Next, the solder resist layer 31 is formed by forming a photosensitive epoxy or polyimide layer on the surfaces of the insulating layer 211 and the conductor layer 212. Then, using a photolithography technology, the openings (31a) that respectively define the conductor pads (32p) are formed.

Next, as illustrated in FIG. 2N, the support substrate (GS) is removed. The lower surfaces of the conductor pads (12p) and the lower surface of the insulating layer 11 are exposed. In removing the support substrate (GS), the adhesive layer (AL) is irradiated with, for example, laser and is softened, and then the support substrate (GS) is peeled off from the conductor pads (12p) and the insulating layer 11. The adhesive layer (AL) that remains on the surfaces of the conductor pads (12p) and the insulating layer 11 is removed by washing. The wiring substrate 1 illustrated in FIG. 1 is completed.

When the wiring substrate 3 (see FIG. 3E) that includes wiring layers having the form of embedded wirings in the first build-up part is manufactured, for example, similar to the example illustrated in FIG. 2B, after the conductor layer 12 including the multiple conductor pads (12p) is formed on the support substrate (GS) via the adhesive layer (AL), as illustrated in FIG. 3A, an insulating layer 51 covering the conductor layer 12 is laminated. Grooves (T1, T2) are formed in the insulating layer 51. The grooves (T1) are formed at positions where the via conductors are to be formed and penetrate the insulating layer 51 to expose the conductor layer 12 directly below the insulating layer 51. The grooves (T2) are formed at positions corresponding to the conductor patterns of the conductor layer 52 having the form of embedded wirings. In forming the grooves (T1, T2), for example, laser processing using excimer laser is used.

Next, a metal film layer 521 is formed to cover the entire upper surface of the insulating layer 51 and the conductor layer 12 exposed from the grooves (T1) Preferably, the metal film layer 521 is a sputtering film layer formed by sputtering. A plating film layer 522 is formed by electrolytic plating using this metal film layer 521 as a seed layer. The state illustrated in FIG. 3A is formed.

Figure 3B:
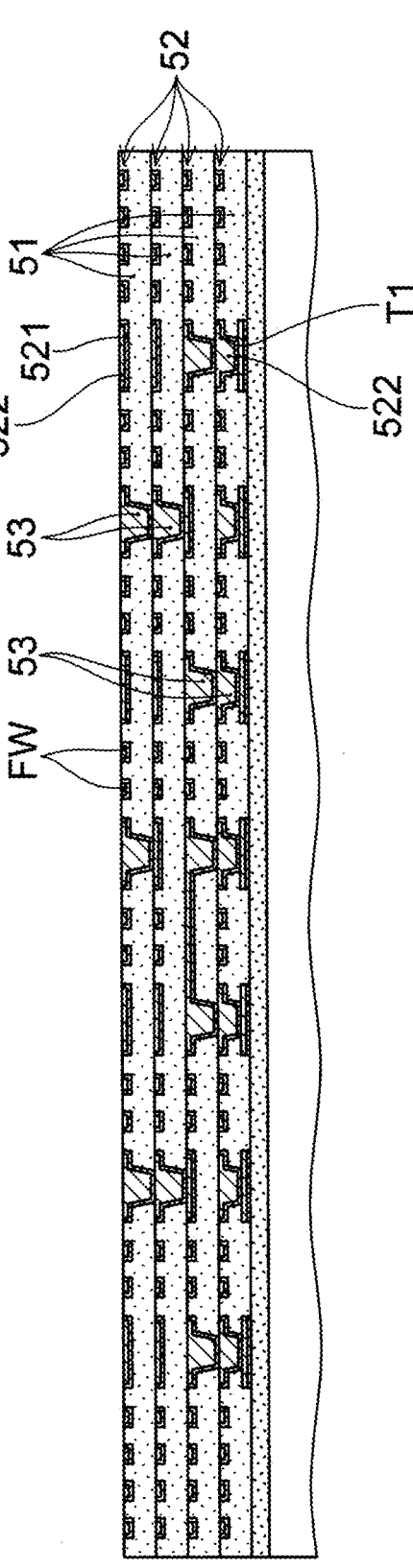
FIG. 3B illustrates an example of a method for manufacturing a wiring substrate according to another embodiment of the present invention.

Next, as illustrated in FIG. 3B, the plating film layer 522 and the metal film layer 521 are partially removed by polishing. The polishing of the plating film layer 522 and the metal film layer 521 is performed, for example, by chemical mechanical polishing (CMP). A conductor layer 52 having a two-layer structure including the metal film layer 521 and the plating film layer 522 is formed. Via conductors 53 are formed by completely filling the grooves (T1) with the plating film layer 522. A form of embedded wirings is formed in which the integrally formed conductor layer 52 and via conductors 53 are embedded in the same insulating layer 51. The surface of the conductor layer 52 exposed from the insulating layer 51 is a highly flat polished surface. On the exposed upper surface of the insulating layer 51 and the conductor layer 52, using the same method, lamination of an insulating layer 51 and formation of a conductor layer 52 are repeated. A desired number of insulating layers 51 and conductor layers 52 having fine wirings (FW), and via conductors 53 penetrating the respective insulating layers, are formed.

Figure 3C:
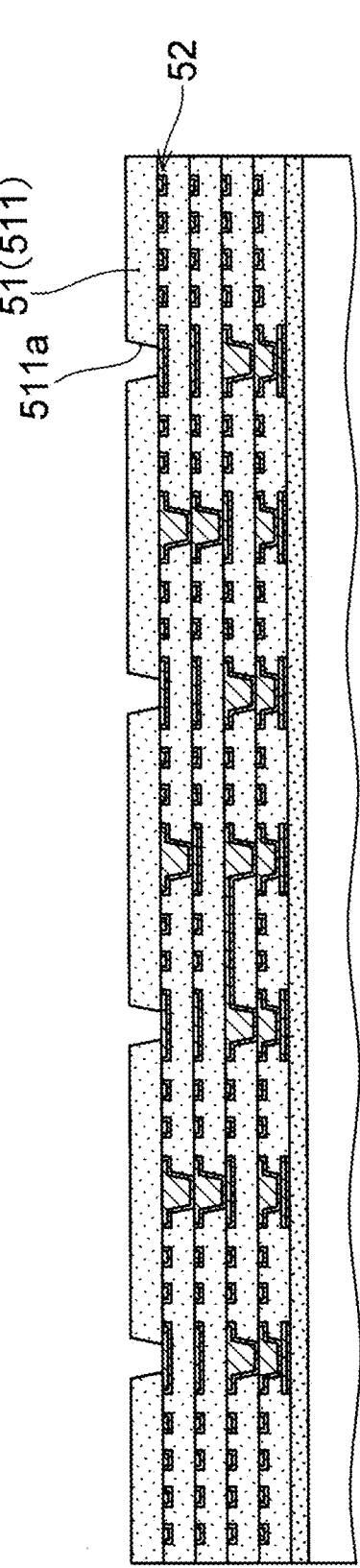
FIG. 3C illustrates an example of a method for manufacturing a wiring substrate according to another embodiment of the present invention.

Next, as illustrated in FIG. 3C, on the upper side of the conductor layer 52, an insulating layer 511, which is the outermost layer among the insulating layers 51 of the first build-up part 50, is formed using the same method as the method for forming the insulating layer 111 (see FIG. 2J). After that, through holes (511a) for forming via conductors 513 are formed using the same method as the method for forming the through holes (111a) (see FIG. 2J).

Figure 3D:
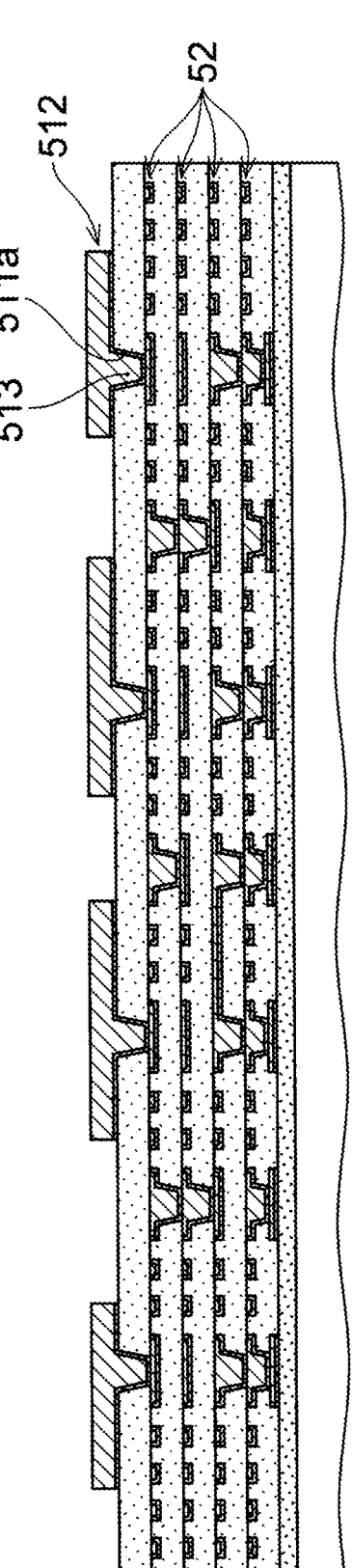
FIG. 3D illustrates an example of a method for manufacturing a wiring substrate according to another embodiment of the present invention.
Figure 3E:
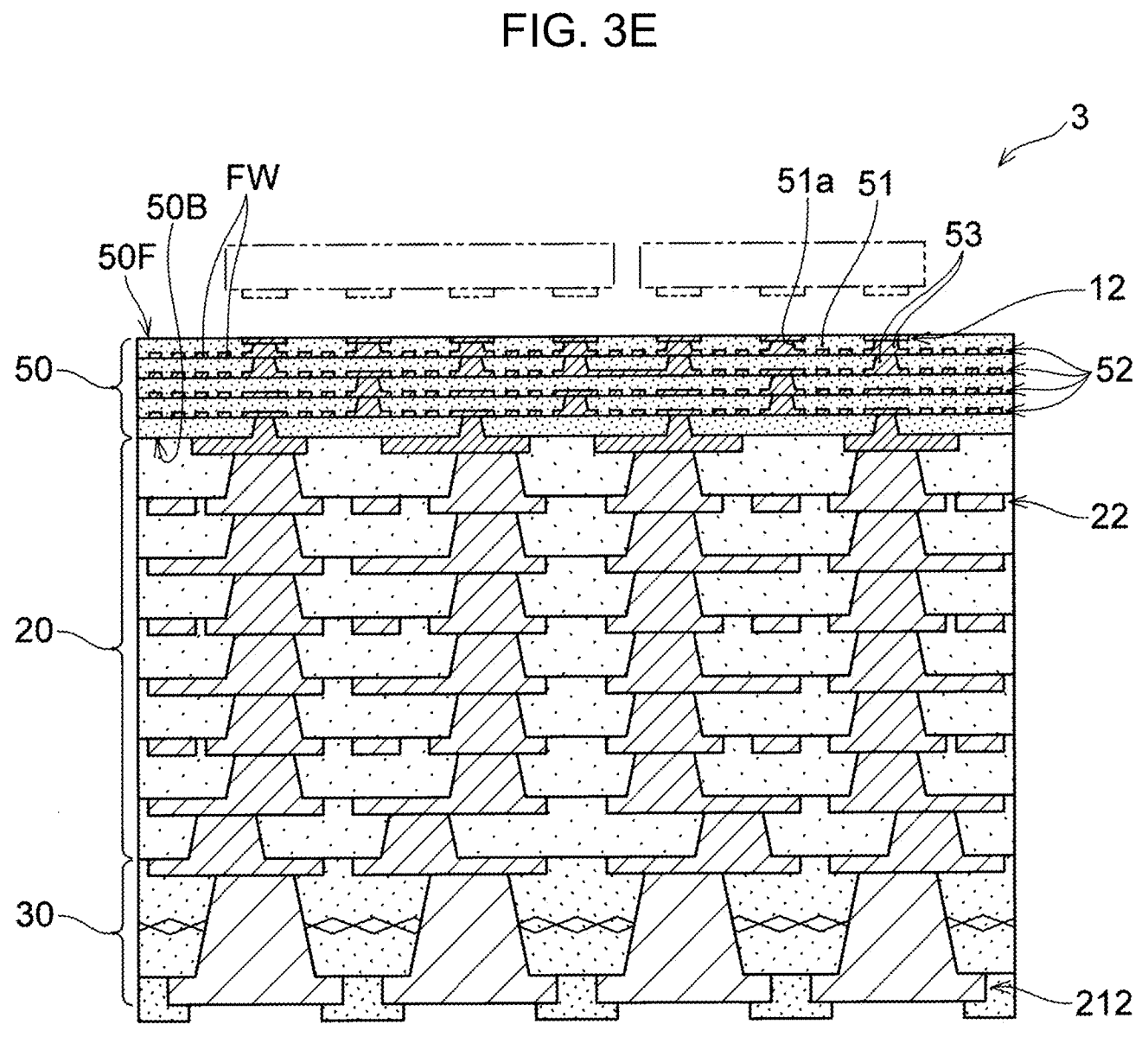

Subsequently, as illustrated in FIG. 3D, at the same time as the via conductors 513 filling the through holes (511a) are formed, a conductor layer 512 is formed using the same method as the method for forming the conductor layer 112 and the via conductors 113 (see FIG. 2K). The first build-up part 50 including the conductor layers 52 having the form of embedded wirings is completed.

After that, build-up parts same as the second build-up part 20 and the third build-up part 30 of the wiring substrate 1 are laminated on the first build-up part 50, and the resulting laminate is removed from the support substrate (GS) (see FIG. 3A), and thereby, as illustrated in FIG. 3E, the wiring substrate 3 is completed.

The wiring substrate of the embodiment is not limited to those having the structures illustrated in the drawings and those having the structures, shapes, and materials exemplified in the present specification. As described above, each build-up part included in a wiring substrate according to an embodiment of the present invention may have any number of insulating layers and conductor layers. For example, it is also possible that the outermost insulating layer and conductor layer on the opposite side with respect to the component mounting surface of the wiring substrate are not respectively formed thicker than the insulating layers 21 and the conductor layers 22 in the second build-up part, and it is also possible that the outermost insulating layer on the opposite side with respect to the component mounting surface of the wiring substrate does not include a core material. Further, the method for manufacturing the wiring substrate of the embodiment is not limited to the methods described with reference to FIGS. 2A-2N and FIGS. 3A-3D. The conditions, processing order, and the like of the methods may be arbitrarily modified. Further, it is also possible that a specific process is omitted or another process is added. For example, a plating layer including a nickel layer and a tin layer may be formed on the surfaces of the conductor pads (12p) exposed after the support substrate (GS) is removed.

Japanese Patent Application Laid-Open Publication No. 2020-4926 describes a wiring substrate that includes a second wiring substrate formed of a build-up wiring layer, and a first wiring substrate joined to the second wiring substrate. The first wiring substrate includes wiring layers formed of finer wirings and an outermost layer having connection pads formed at a finer pitch, compared to the second wiring substrate. The entire contents of this publication are incorporated herein by reference.

In the wiring substrate described in Japanese Patent Application Laid-Open Publication No. 2020-4926, the first wiring substrate and the second wiring substrate are joined via terminals protruding from respective surfaces thereof, and an insulating resin is filled between the first wiring substrate and the second wiring substrate. There is a risk that the presence of the joints between the two wiring substrates may affect quality, or a risk that a yield in manufacturing the wiring substrate may be reduced.

A wiring substrate according to an embodiment of the present invention has a first surface and a second surface on the opposite side with respect to the first surface and includes: a first build-up part and a second build-up part. The first build-up part and the second build-up part each include: alternately laminated multiple insulating layers and multiple conductor layers; and via conductors that are provided in the insulating layers and connect the conductor layers separated by the insulating layers. The first build-up part is laminated on the second build-up part and is positioned closer to the first surface side than the second build-up part is. A wiring width and an inter-wiring distance of wirings in a first conductor layer included in the first build-up part are smaller than a wiring width and an inter-wiring distance of wirings in a second conductor layer included in the second build-up part. An aspect ratio of the wirings in the first conductor layer is 2.0 or more and 4.0 or less. The wiring width of the wirings in the first conductor layer is 3 μm or less. The inter-wiring distance of the wirings in the first conductor layer is 3 μm or less. A surface of the first conductor layer on the second surface side is a polished surface.

According to an embodiment of the present invention, a wiring substrate improved in quality including multiple conductor layers with different wiring densities can be provided with a high yield.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising
   a first build-up part comprising a plurality of first insulating layers, a plurality of first conductor layers and a plurality of first via conductors formed in the first insulating layers and connecting the first conductor layers;
   a second build-up part laminated to the first build-up part and comprising a plurality of second insulating layers, a plurality of second conductor layers and a plurality of second via conductors formed in the second insulating layers and connecting the second conductor layers; and
   a third build-up part laminated on the second build-up part on an opposite side with respect to the first build-up part and comprising a third insulating layer, a third conductor layer formed on the third insulating layer, and a plurality of third via conductors formed in the third insulating layer and connecting the third conductor layer and one of the second conductor layers in the second build-up part such that the second build-up part includes a greater number of conductor layers than the third build-up part,
   wherein the plurality of first conductor layers in the first build-up part and the plurality of second conductor layers in the second build-up part include a plurality of wirings such that a wiring width and an inter-wiring distance of the wirings in the first conductor layers are smaller than a wiring width and an inter-wiring distance of the wirings in the second conductor layers, an aspect ratio of the wirings in the first conductor layers is in a range of 2.0 to 4.0, the wiring width of the wirings in the first conductor layers is 3 μm or less, and the inter-wiring distance of the wirings in the first conductor layers is 3 μm or less, and the second and third build-up parts are formed such that the third insulating layer has a thickness that is greater than a thickness of each of the second insulating layers in the second build-up part and that the third conductor layer has a thickness that is greater than a thickness of each of the second conductor layers in the second build-up part.

2. The wiring substrate according to claim 1, wherein the plurality of second insulating layers in the second build-up part does not contain a core material.

3. The wiring substrate according to claim 1, wherein the third insulating layer includes a core material.

4. The wiring substrate according to claim 3, wherein the core material is a glass fiber.

5. The wiring substrate according to claim 3, wherein the plurality of second insulating layers in the second build-up part does not contain a core material.

6. The wiring substrate according to claim 1, wherein the wirings in the first conductor layers have a thickness of 7 μm or less, and the wirings in the second conductor layers have a thickness of 10 μm or more.

7. The wiring substrate according to claim 1, wherein the first and second build-up parts are formed such that each of the first and second via conductors has a diameter decreasing in a direction from the second build-up part toward the first build-up part.

8. The wiring substrate according to claim 1, wherein the plurality of first via conductors in the first build-up part have an aspect ratio in a range of 0.5 to 1.0.

9. The wiring substrate according to claim 1, wherein each of the first conductor layers has a two-layer structure comprising a metal film layer and a plating film layer formed on the metal film layer such that the metal film layer is a sputtering film layer, and each of the second conductor layers has a two-layer structure comprising a metal film layer and a plating film layer formed on the metal film layer such that the metal film layer is an electroless plating film layer.

10. The wiring substrate according to claim 1, wherein the first build-up part is formed such that each of the first conductor layers is embedded in a respective one of the first insulating layers.

11. The wiring substrate according to claim 1, wherein the first build-up part includes a plurality of conductor pads embedded in an outermost first insulating layer of the first insulating layers such that the outermost first insulating layer is forming a surface of the wiring substrate and that the plurality of conductor pads has a plurality of component mounting surfaces exposed on the surface of the wiring substrate respectively and is forming a component mounting region.

12. The wiring substrate according to claim 1, wherein the first build-up part is formed such that each of the first conductor layers has a polished surface facing toward the second build-up part.

13. The wiring substrate according to claim 12, wherein the third insulating layer includes a core material.

14. The wiring substrate according to claim 13, wherein the core material is a glass fiber.

15. The wiring substrate according to claim 12, wherein the wirings in the first conductor layers have a thickness of $7 \mu m$ or less, and the wirings in the second conductor layers have a thickness of $10 \mu m$ or more.

16. The wiring substrate according to claim 12, wherein the first and second build-up parts are formed such that each of the first and second via conductors has a diameter decreasing in a direction from the second build-up part toward the first build-up part.

17. The wiring substrate according to claim 12, wherein the plurality of first via conductors in the first build-up part have an aspect ratio in a range of 0.5 to 1.0.

18. The wiring substrate according to claim 12, wherein each of the first conductor layers has a two-layer structure comprising a metal film layer and a plating film layer formed on the metal film layer such that the metal film layer is a sputtering film layer, and each of the second conductor layers has a two-layer structure comprising a metal film layer and a plating film layer formed on the metal film layer such that the metal film layer is an electroless plating film layer.

19. The wiring substrate according to claim 12, wherein the first build-up part is formed such that each of the first conductor layers is embedded in a respective one of the first insulating layers.

20. The wiring substrate according to claim 12, wherein the first build-up part includes a plurality of conductor pads embedded in an outermost first insulating layer of the first insulating layers such that the outermost first insulating layer is forming a surface of the wiring substrate and that the plurality of conductor pads has a plurality of component mounting surfaces exposed on the surface of the wiring substrate respectively and is forming a component mounting region.

\* \* \* \* \*